(12) United States Patent
Kim et al.

(10) Patent No.: US 12,057,193 B2
(45) Date of Patent: *Aug. 6, 2024

(54) CLOCK SYNCHRONIZING METHOD OF A MULTIPLE CLOCK DOMAIN MEMORY DEVICE

(71) Applicant: SAMSUNG ELECTRONICS CO., LTD., Suwon-si (KR)

(72) Inventors: Hye-Ran Kim, Hwaseong-si (KR); Seong-Hwan Jeon, Hwaseong-si (KR); Tae-Young Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/111,925

(22) Filed: Feb. 21, 2023

(65) Prior Publication Data

US 2023/0206974 A1    Jun. 29, 2023

Related U.S. Application Data

(63) Continuation of application No. 17/588,566, filed on Jan. 31, 2022, now Pat. No. 11,615,825, which is a
(Continued)

(30) Foreign Application Priority Data

Oct. 7, 2016    (KR) .......................... 10-2016-0129872

(51) Int. Cl.
*G06F 1/12*      (2006.01)
*G06F 13/16*     (2006.01)
(Continued)

(52) U.S. Cl.
CPC ................ *G11C 7/222* (2013.01); *G06F 1/12* (2013.01); *G06F 13/1689* (2013.01);
(Continued)

(58) Field of Classification Search
None
See application file for complete search history.

(56) References Cited

U.S. PATENT DOCUMENTS

| 4,475,085 A | 10/1984 | Yahata et al. |
| 6,160,433 A | 12/2000 | Yamazaki |

(Continued)

FOREIGN PATENT DOCUMENTS

| CN | 104699640 | 6/2015 |
| TW | I301910 | 10/2008 |
| TW | I303441 | 11/2008 |

*Primary Examiner* — Nitin C Patel
(74) *Attorney, Agent, or Firm* — F. Chau & Associates, LLC

(57) ABSTRACT

A memory device includes: a first clock receiver configured to receive a first clock signal; a second clock receiver configured to receive a second clock signal when data is input or output, wherein the second clock signal has a first clock frequency in a preamble period, and has a second clock frequency different from the first clock frequency after the preamble period; a command decoder configured to receive a clock synchronization command synchronized with the first clock signal and generate a clock synchronization signal, wherein the clock synchronization signal is generated during the preamble period; and a clock synchronizing circuit configured to generate a plurality of division clock signals in response to the second clock signal, latch the clock synchronization signal during the preamble period,
(Continued)

and selectively provide the plurality of division clock signals as internal data clock signals according to a result of the latching.

20 Claims, 15 Drawing Sheets

Related U.S. Application Data continuation of application No. 17/190,656, filed on Mar. 3, 2021, now Pat. No. 11,282,555, which is a continuation of application No. 16/731,769, filed on Dec. 31, 2019, now Pat. No. 10,943,630, which is a continuation of application No. 15/723,532, filed on Oct. 3, 2017, now Pat. No. 10,553,264.

(51) Int. Cl.
  *G11C 7/10* (2006.01)
  *G11C 7/22* (2006.01)
  *G11C 11/4076* (2006.01)
  *G11C 11/4093* (2006.01)

(52) U.S. Cl.
  CPC .......... *G11C 7/1051* (2013.01); *G11C 7/1066* (2013.01); *G11C 7/1078* (2013.01); *G11C 7/1093* (2013.01); *G11C 11/4076* (2013.01); *G11C 11/4093* (2013.01); *G11C 2207/2254* (2013.01)

(56) References Cited

U.S. PATENT DOCUMENTS

| | | |
|---|---|---|
| 7,196,948 B1 | 3/2007 | Vemula et al. |
| 7,639,764 B2 | 12/2009 | Cohen |
| 7,668,276 B2 | 2/2010 | Hampel et al. |
| 7,685,393 B2 | 3/2010 | Gillingham et al. |
| 8,055,930 B2 | 11/2011 | Bae et al. |
| 8,242,819 B2 | 8/2012 | Bae et al. |
| 8,347,198 B2 | 1/2013 | Shin et al. |
| 8,503,254 B2 | 8/2013 | Park |
| 8,593,901 B2 | 11/2013 | Oh et al. |
| 8,825,978 B2 | 9/2014 | Chaung et al. |
| 9,123,406 B2 | 9/2015 | Lee et al. |
| 10,553,264 B2 | 2/2020 | Kim et al. |
| 10,943,630 B2 | 3/2021 | Kim et al. |
| 11,282,555 B2 | 3/2022 | Kim et al. |
| 2004/0174197 A1 | 9/2004 | Kida et al. |
| 2008/0112525 A1 | 5/2008 | Do et al. |
| 2010/0054059 A1 | 3/2010 | Yoon et al. |
| 2011/0158030 A1 | 6/2011 | Bae et al. |
| 2013/0326184 A1 | 12/2013 | Chaung et al. |
| 2013/0346785 A1 | 12/2013 | Lossin et al. |
| 2014/0016404 A1 | 1/2014 | Kim et al. |
| 2017/0026969 A1 | 1/2017 | Rong et al. |
| 2018/0102151 A1 | 4/2018 | Kim et al. |
| 2020/0143858 A1 | 5/2020 | Kim et al. |
| 2021/0183420 A1 | 6/2021 | Kim et al. |
| 2022/0157357 A1 | 5/2022 | Kim et al. |

- Aligned Case -

- Aligned Case -

CLOCK SYNCHRONIZING METHOD OF A MULTIPLE CLOCK DOMAIN MEMORY DEVICE

CROSS-REFERENCE TO RELATED APPLICATIONS

This application is a continuation of U.S. patent application Ser. No. 17/588,566 filed on Jan. 31, 2022, now U.S. Pat. No. 11,615,825 issued on Mar. 28, 2023, which is a continuation of U.S. patent application Ser. No. 17/190,656 filed on Mar. 3, 2021, now U.S. Pat. No. 11,282,555 issued on Mar. 22, 2022, which is a continuation of U.S. patent application Ser. No. 16/731,769 filed on Dec. 31, 2019, now U.S. Pat. No. 10,943,630 issued on Mar. 9, 2021, which is a continuation of U.S. patent application Ser. No. 15/723,532 filed on Oct. 3, 2017, now U.S. Pat. No. 10,553,264 issued on Feb. 4, 2020, which claims priority under 35 U.S.C. § 119 to Korean Patent Application No. 10-2016-0129872, filed on Oct. 7, 2016, in the Korean Intellectual Property Office, the disclosures of which are incorporated by reference herein in their entireties.

TECHNICAL FIELD

The inventive concept relates to a memory device, and more particularly, to a memory device that performs a clock synchronizing operation by using a clock signal having a dynamic frequency.

DISCUSSION OF RELATED ART

Dynamic random access memory (DRAM) may receive a command and an address in synchronization with a main clock signal CK. The DRAM may also receive or transmit data in synchronization with a data clock signal WCK. A DRAM performs two main operations. These include an operation of writing data in a memory cell array included in a core circuit and an operation of reading the data from the memory cell array. Control signals, which are generated to control the core circuit based on the main clock signal CK, and data, which is input/output to/from the core circuit based on the data clock signal WCK, are supplied in different clock domains. Therefore, the DRAM synchronizes the main clock signal CK and the data clock signal WCK so that input/output data can be stably latched in response to the control signals. As an operation frequency of the DRAM increases, an aligning margin of a setup time or a hold time is reduced when synchronizing the main clock signal CK and the data clock signal WCK. Accordingly, these signals may not be synched with each other.

SUMMARY

An exemplary embodiment of the inventive concept provides a memory device including a first clock receiver configured to receive a first clock signal; a second clock receiver configured to receive a second clock signal when data is input or output, wherein the second clock signal has a first clock frequency in a preamble period, and has a second clock frequency different from the first clock frequency after the preamble period; a command decoder configured to receive a clock synchronization command synchronized with the first clock signal and generate a clock synchronization signal, wherein the clock synchronization signal is generated during the preamble period; and a clock synchronizing circuit configured to generate a plurality of division clock signals in response to the second clock signal, latch the clock synchronization signal during the preamble period, and selectively provide the plurality of division clock signals as internal data clock signals according to a result of the latching.

An exemplary embodiment of the inventive concept provides a memory device including: a data clock receiver configured to receive a data clock signal when data is input or output, wherein the data clock signal has a first clock frequency in a preamble period before a time when the data is input or output, and has a second clock frequency different from the first clock frequency after the preamble period; a command decoder configured to receive a clock synchronization command to generate a clock synchronization signal during the preamble period; and a clock synchronizing circuit configured to divide the data clock signal and generate a plurality of division clock signals, latch the clock synchronization signal in response to a division clock signal selected from among the plurality of division clock signals, and selectively output the plurality of division clock signals as internal data clock signals according to a result of the latch.

An exemplary embodiment of the inventive concept provides a clock synchronizing method performed by a memory device, the clock synchronizing method including: receiving a first clock signal; receiving a second clock signal which has a first clock frequency in a preamble period before a time when data is input or output, and has a second clock frequency different from the first clock frequency after the preamble period; receiving a clock synchronization command synchronized with the first clock signal and generating a clock synchronization signal during the preamble period; dividing the second clock signal and generating a plurality of division clock signals; latching the clock synchronization signal in response to a division clock signal selected from among the plurality of division clock signals; and selectively outputting the plurality of division clock signals as internal data clock signals according to a result of the latching.

An exemplary embodiment of the inventive concept provides a memory device including: a first clock receiver configured to receive a first clock signal; a second clock receiver configured to receive a second clock signal, wherein the second clock signal has a first frequency in a first period and a second frequency in a second period after the first period; a command decoder configured to generate a clock synchronization signal in the first period in response to a command; and a clock synchronizing circuit configured to divide the second clock signal into a plurality of divided clock signals and output the divided output clock signals as internal data clock signals in response to the clock synchronization signal.

An exemplary embodiment of the inventive concept provides a memory device including: a first clock receiver configured to receive a first clock signal; a second clock receiver configured to receive a second clock signal, wherein the second clock signal has a first frequency in a first period and a second frequency in a second period after the first period; a command decoder configured to generate a clock synchronization signal in the first period in response to a command; and a clock synchronizing circuit configured to divide the second clock signal into a plurality of divided clock signals and output the divided output clock signals as internal data clock signals in response to the clock synchronization signal.

An exemplary embodiment of the inventive concept provides a memory device including: a main clock receiver configured to receive a main clock signal and generate an internal main clock signal; a data clock receiver configured to receive a data clock signal; a command decoder configured to receive an instruction from a memory controller and to generate an internal synchronization signal in response to the instruction, and a clock synchronizing circuit configured to receive the data clock signal buffered through the data clock receiver and the internal synchronization signal to perform a clock synchronization operation in which an internal data clock signal is generated, wherein the internal synchronization signal has a high level during a preamble period of the main clock signal.

An exemplary embodiment of the inventive concept provides a method including: receiving a main clock signal; receiving a data clock signal; receiving a clock synchronizing command and generating an internal clock synchronization signal, generating first, second, third and fourth divided data clock signals based on the data clock signal; comparing the internal clock synchronization signal with the second divided data clock signal and generating a first phase detection signal, and comparing the internal clock synchronization signal with the fourth divided data clock signal and generating a second phase detection signal; and synchronizing the main clock signal and the data clock signal by using first, second, third and fourth internal data clock signals.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
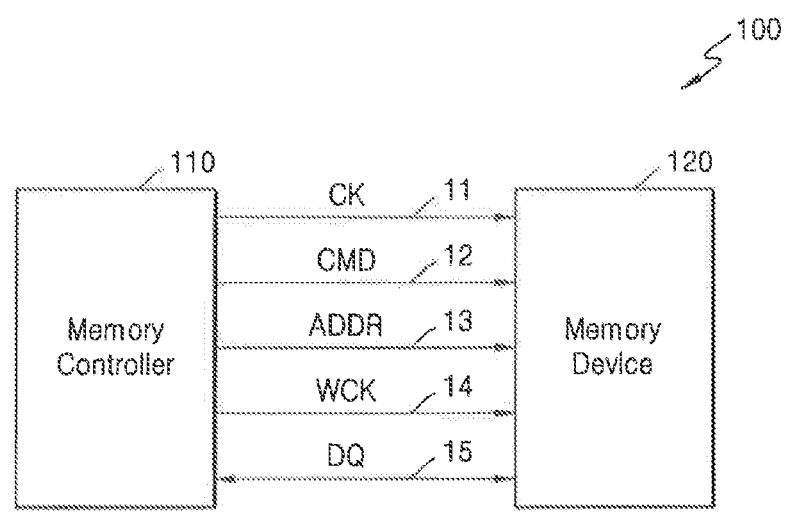
FIG. 1 is a diagram for describing a memory system including a multiple clock domain memory device according to an exemplary embodiment of the inventive concept.

FIG. 1 is a diagram of a memory system 100 including a multiple clock domain memory device according to an exemplary embodiment of the inventive concept.

Referring to FIG. 1, the memory system 100 may include a memory controller 110 and a memory device 120. The memory system 100 may support data communication between the memory controller 110 and the memory device 120 and uses a main clock signal CK and a data clock signal WCK.

A first clock signal line 11, a command bus 12, an address bus 13, a second clock signal line 14, and a data bus 15 may be connected between the memory controller 110 and the memory device 120. According to an exemplary embodiment of the inventive concept, the memory system 100 may support the data communication based on various clock signals in addition to the main clock signal CK and the data clock signal WCK.

The main clock signal CK generated by the memory controller 110 may be supplied to the memory device 120 through the first clock signal line 11. For example, the main clock signal CK may be supplied as a continuous alternating inversion signal along with an inversion main clock signal CKB. Regarding a main clock signal pair CK and CKB, rising/falling edges may be detected with respect to an intersection point of the main clock signal CK and the inversion main clock signal CKB, and thus, a timing accuracy is increased. Herein, the main clock signal CK may be referred to as a first clock signal CK.

According to an exemplary embodiment of the inventive concept, a single main clock signal CK may be supplied as the continuous alternating inversion signal to the first clock signal line 11. In this case, to distinguish the rising/falling edges of the main clock signal CK, the main clock signal CK is compared with a reference voltage Vref. However, when noise fluctuation and/or the like occurs in the reference voltage Vref, a shift occurs in detecting the main clock signal CK, and thus, the timing accuracy is reduced compared to a case of using a main clock signal pair CK and CKB.

Therefore, the first clock signal line 11 may transmit a complementary continuous alternating inversion signal based on the main clock signal pair CK and CKB. In this case, the first clock signal line 11 may include two signal lines for transmitting the main clock signals CK and CKB. The clock signal CK described herein may refer to the main clock signal pair CK and CKB.

A command CMD and an address ADDR supplied from the memory controller 110 may be supplied to the memory device 120 through the command bus 12 and the address bus 13, respectively. According to an exemplary embodiment of the inventive concept, the command CMD and the address ADDR may be supplied to the memory device 120 through a shared command/address bus. The command CMD or the address ADDR may be time-serially delivered along the shared command/address bus.

The data clock signal WCK and data DQ may be transmitted to a data interface between the memory controller 110 and the memory device 120. The data clock signal WCK generated by the memory controller 110 may be supplied to the memory device 120 through the second clock signal line 14. The data clock signal WCK may be supplied as a continuous alternating inversion signal along with an inversion data clock WCKB. Regarding a data clock signal pair WCK and WCKB, rising/falling edges may be detected with respect to an intersection point of the data clock signal WCK and the inversion data clock signal WCKB, and thus, a timing accuracy is increased.

The second clock signal line 14 may transmit a complementary continuous alternating inversion signal based on the data clock signal pair WCK and WCKB. In this case, the second clock signal line 14 may be configured to include two signal lines for transmitting the data clock signals WCK and WCKB. The data clock signal WCK described herein may refer to the data clock signal pair WCK and WCKB. Herein, the data clock signal WCK may be referred to as a second clock signal WCK.

The data DQ synchronized with the data clock signal WCK may be transmitted through the data bus 15 connected between the memory controller 110 and the memory device 120. For example, write data DQ, which corresponds to a burst length BL and is supplied from the memory controller 110, may be transmitted to the memory device 120 through the data bus 15 in synchronization with the data clock signal WCK. The write data DQ, which corresponds to the burst length BL and is read from the memory device 120, may be latched in synchronization with the data clock signal WCK and may be transmitted to the memory controller 110 through the data bus 15.

Accordingly, a data interface speed between the memory controller 110 and the memory device 120 increases.

If, however, the memory device 120 is implemented with DRAM, a core circuit of the DRAM may not operate according to a speed of a high speed data interface. In other words, there is a limitation in increasing a frequency of the main clock signal CK transmitted to the core circuit of the DRAM. Therefore, the DRAM may use a method of increasing a data interface speed while maintaining an operation speed of the core circuit of the DRAM.

Figure 2:
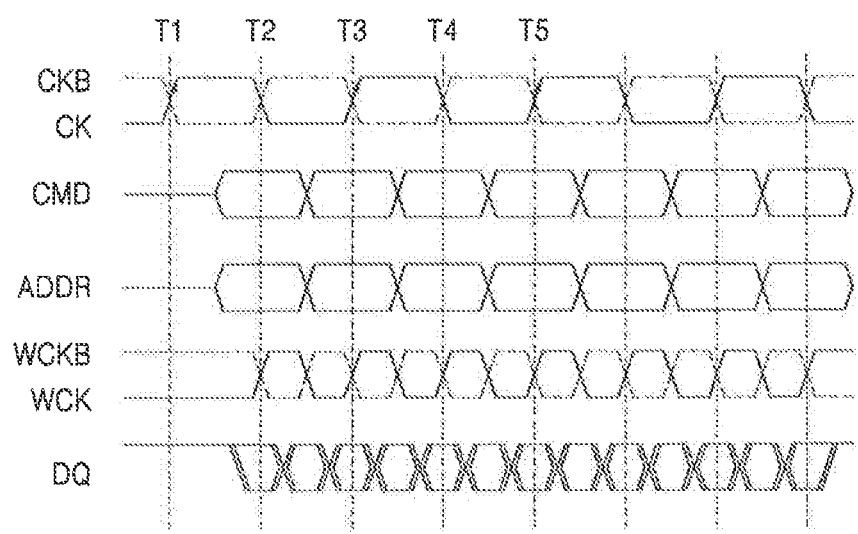
FIG. 2 is a timing diagram for describing a conventional high speed data interface operation of the memory device of FIG. 1.

FIG. 2 is a timing diagram for describing a conventional high speed data interface operation of the memory device of FIG. 1.

Referring to FIG. 2 and FIG. 1, the main clock signal CK may be transmitted from the memory controller 110, and the command CMD and the address signal ADDR may be transmitted based on the main clock signal CK. The data DQ may be transmitted based on the data clock signal WCK. For a high speed data interface, a frequency of the data clock signal WCK may be set to be twice the frequency of the main clock signal CK.

It is assumed that a data writing operation is performed in the memory device 120. The memory device 120 may receive the main clock signal CK from a time T1 and may receive a write command CMD and a write address signal ADDR based on the main clock signal CK at a time T2. In addition, at the time T2, the memory device 120 may receive the write data DQ corresponding to the burst length, based on the data clock signal WCK.

In reference to FIG. 2, the memory device 120 is described as receiving the write command CMD and the write data DQ at the time T2. It is to be understood, however, that the memory device 120 may receive the write command CMD, and then, may receive the write data DQ after a write latency. The write latency may be represented as a multiple of a cycle of the main clock signal CK.

In reference to FIG. 2, it is also assumed that a data reading operation is performed in the memory device 120. The memory device 120 may receive the main clock signal CK from the time T1 and may receive a read command CMD and a read address signal ADDR based on the main clock signal CK at the time T2. In addition, after the read command CMD is received, the memory device 120 may receive read data DQ based on the data clock signal WCK after a read latency. The read latency may be represented as a multiple of the cycle of the main clock signal CK.

In a write operation, the memory device 120 may sample the data DQ input from the memory controller 110 by using the data clock signal WCK, and may store data, obtained through the sampling, in a memory cell array by using the main clock signal CK. In addition, in a read operation, the memory device 120 may read the data from the memory cell array by using the main clock signal CK and may transmit the read data to the memory controller 110 by using the data clock signal WCK. As described above, the memory device 120 may operate in different clock domains, for example, a multiple clock domain.

In the memory device 120, data transfer is performed between a domain which operates based on the main clock signal CK and a domain which operates based on the data clock signal WCK. In other words, domain crossing occurs between the main clock signal CK and the data clock signal WCK, and in this case, missing data may occur. To prevent missing data, a clock synchronizing operation between the main clock signal CK and the data clock signal WCK is performed. The clock synchronizing operation between the main clock signal CK and the data clock signal WCK will be described below with reference to FIGS. 3 and 4.

Figure 3:
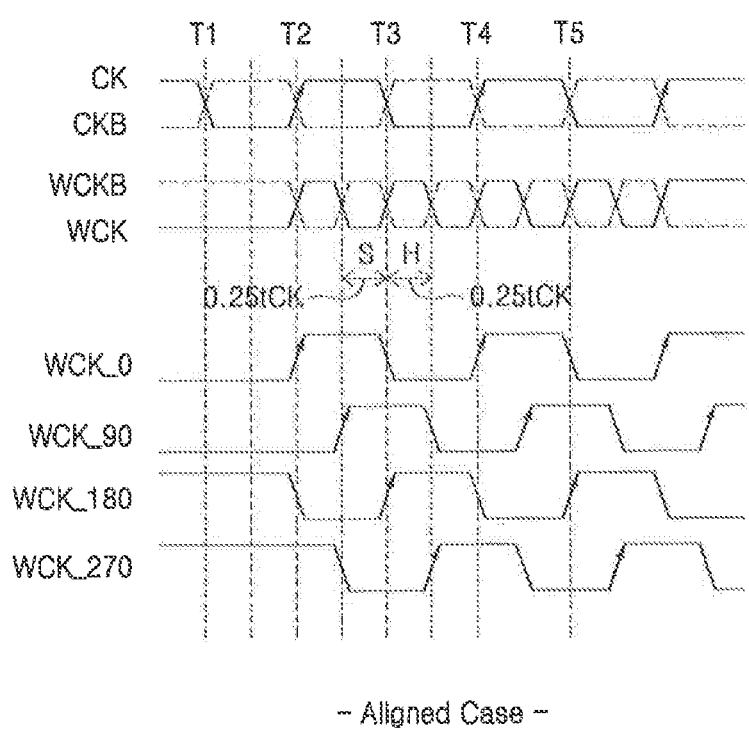
FIGS. 3 and 4 are diagrams for describing a conventional clock synchronizing operation of the memory device of FIG. 1.
Figure 4:
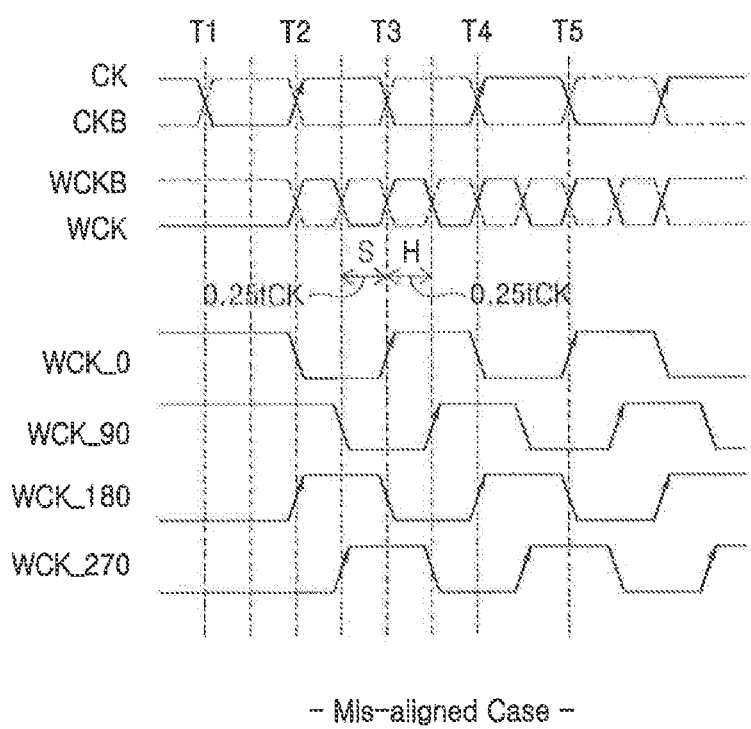

FIGS. 3 and 4 are diagrams for describing a conventional clock synchronizing operation in the memory device of FIG. 1. FIG. 3 is for describing an aligned state in which clock synchronization between the main clock signal CK and the data clock signal WCK takes place. FIG. 4 is for describing a misaligned state in which clock synchronization does not take place.

Referring to FIG. 3, the main clock signal CK and the data clock signal WCK may be received by the memory device 120 (see FIG. 1). A frequency of the data clock signal WCK may be higher than that of the main clock signal CK. For example, a frequency of the data clock signal WCK may be twice a frequency of the main clock signal CK.

The main clock signal CK may be received from a time T1. A falling edge of the main clock signal CK may be input at the time T1, a rising edge of the main clock signal CK may be input at a time T2, a falling edge of the main clock signal CK may be input at a time T3, a rising edge of the main clock signal CK may be input at a time T4, and a falling edge of the main clock signal CK may be input at a time T5.

The data clock signal WCK may be received from the time T2. Since the data clock signal WCK is supplied along with corresponding data DQ whenever the write data DQ is input or the read data DQ is output, the data clock signal WCK may be in a deactivation state at the time T1, and then, may be activated at the time T2 when the corresponding data DQ is supplied. In other words, unlike the main clock signal CK, which is always supplied, the data clock signal WCK may be supplied when it is needed so that power consumption may be reduced.

When the data clock signal WCK is received at the time T2, the memory device 120 may divide the data clock signal WCK to generate a plurality of divided data clock signals WCK_0, WCK_90, WCK_180, and WCK_270. In this case, the memory device 120 may twice-divide the data clock signal WCK to generate the plurality of divided data clock signals WCK_0, WCK_90, WCK_180, and WCK_270. Frequencies of the divided data clock signals WCK_0, WCK_90, WCK_180, and WCK_270 may be the same as that of the main clock signal CK.

From the time T2 when the data clock signal WCK is received, a first divided data clock signal WCK_0 may be generated to have the same phase as that of the main clock signal CK, a second divided data clock signal WCK_90 may be generated to have a phase obtained through a 90-degree shift from a phase of the main clock signal CK, a third divided data clock signal WCK_180 may be generated to have a phase obtained through a 180-degree shift from the phase of the main clock signal CK, and a fourth divided data clock signal WCK_270 may be generated to have a phase obtained through a 270-degree shift from the phase of the main clock signal CK.

As shown in FIG. 3, with regard the first divided data clock signal WCK_0, at the time T2, a rising edge of the first divided data clock signal WCK_0 may correspond to a rising edge of the main clock signal CK. At the time T3, a falling edge of the first divided data clock signal WCK_0 may correspond to a falling edge of the main clock signal CK. At the time T4, a rising edge of the first divided data clock signal WCK_0 may correspond to the rising edge of the main clock signal CK. In addition, at the time T5, a falling edge of the first divided data clock signal WCK_0 may correspond to the falling edge of the main clock signal CK.

The memory device 120, for example, may have an align margin including a setup time S of 0.25 tCK and a hold time H of 0.25 tCK when determining a falling edge of the first divided data clock signal WCK_0 at the time T3. The memory device 120 may determine a logic level of the first divided data clock signal WCK_0 in response to a falling edge of the main clock signal CK, based on the setup time S of 0.25 tCK and the hold time H of 0.25 tCK. When the determined logic level of the first divided data clock signal WCK_0 is logic low, the memory device 120 may determine the first divided data clock signal WCK_0 as having a falling edge.

The setup time S of 0.25 tCK and the hold time H of 0.25 tCK at the time T3 may be an ideal align margin. Here, tCK denotes a clock cycle period of the main clock signal CK. However, in designing the memory device 120, an align margin capable of being actually applied may be strictly applied. For example, the align margin may be defined as the setup time S of 0.25 tCK and the hold time H of 0.25 tCK.

Due to the setup time S of 0.25 tCK and the hold time H of 0.25 tCK which are strictly defined, the align margin can become insufficient when determining a rising edge of the first divided data clock signal WCK_0. Thus, a clock synchronizing operation of the memory device 120 may not work.

In FIG. 3, it can be seen that a rising edge of the first divided data clock signal WCK_0 corresponds to the rising edge of the main clock signal CK, and a falling edge of the first divided data clock signal WCK_0 corresponds to the falling edge of the main clock signal CK. Furthermore, the second divided clock signal WCK_90 has a high level at T3. This shows an aligned state in which clock synchronization takes place between the main clock signal CK and the data clock signal WCK. On the other hand, FIG. 4 shows a misaligned state wherein clock synchronization does not take place between the main clock signal CK and the data clock signal WCK.

Referring to FIG. 4, as in FIG. 3, the memory device 120 may receive the main clock signal CK and the data clock signal WCK and may divide the data clock signal WCK to generate a plurality of divided data clock signals WCK_0, WCK_90, WCK_180, and WCK_270.

Regarding a first divided data clock signal WCK_0 in FIG. 4, at a time T2 when the data clock signal WCK is received, a falling edge of the first divided data clock signal WCK_0 may be generated unlike a rising edge of the main clock signal CK. At a time T3, a rising edge of the first divided data clock signal WCK_0 may be generated unlike a falling edge of the main clock signal CK. At a time T4, a falling edge of the first divided data clock signal WCK_0 may be generated unlike the rising edge of the main clock signal CK. In addition, at a time T5, a rising edge of the first divided data clock signal WCK_0 may be generated unlike the falling edge of the main clock signal CK.

Regarding FIG. 4, it can be seen that a falling edge of the first divided data clock signal WCK_0 is generated in the rising edge of the main clock signal CK, and a rising edge of the first divided data clock signal WCK_0 is generated in the falling edge of the main clock signal CK. Furthermore, the second divided clock signal WCK_90 has a low level at T3. This shows a misaligned state in which clock synchronization does not take place between the main clock signal CK and the data clock signal WCK.

For example, at the time T3, to determine that the first divided data clock signal WCK_0 is generated as a rising edge with the falling edge of the main clock signal CK, the memory device 120 may determine a logic level of the first divided data clock signal WCK_0 in response to a falling edge of the main clock signal CK, based on a setup time S of 0.25 tCK and a hold time H of 0.25 tCK. When the determined logic level of the first divided data clock signal WCK_0 is logic high, the memory device 120 may determine the first divided data clock signal WCK_0 as having a rising edge.

Similarly to FIG. 3, the setup time S of 0.25 tCK and the hold time H of 0.25 tCK at the time T3 may be an ideal align margin. However, an align margin capable of being actually applied may be strictly applied. For example, the align margin may be defined as the setup time S of 0.25 tCK and the hold time H of 0.25 tCK. In this case, due to the insufficiency of the align margin caused by to the setup time S of 0.25 tCK and the hold time H of 0.25 tCK, which are strictly defined, a clock synchronizing operation of the memory device 120 may not work.

In an exemplary embodiment of the inventive concept, a method of performing the clock synchronizing operation by using the data clock signal WCK having a variable frequency (e.g., a dynamic frequency) is used to correct for the insufficiency of the align margin in the clock synchronizing operation.

Figure 5A:
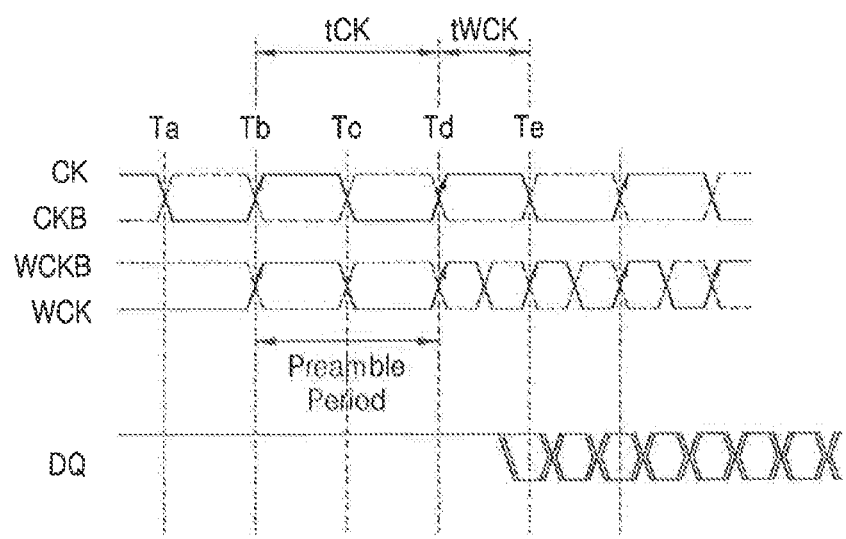
FIGS. 5A and 5B are timing diagrams for describing a data clock signal having a dynamic frequency according to an exemplary embodiment of the inventive concept.
Figure 5B:
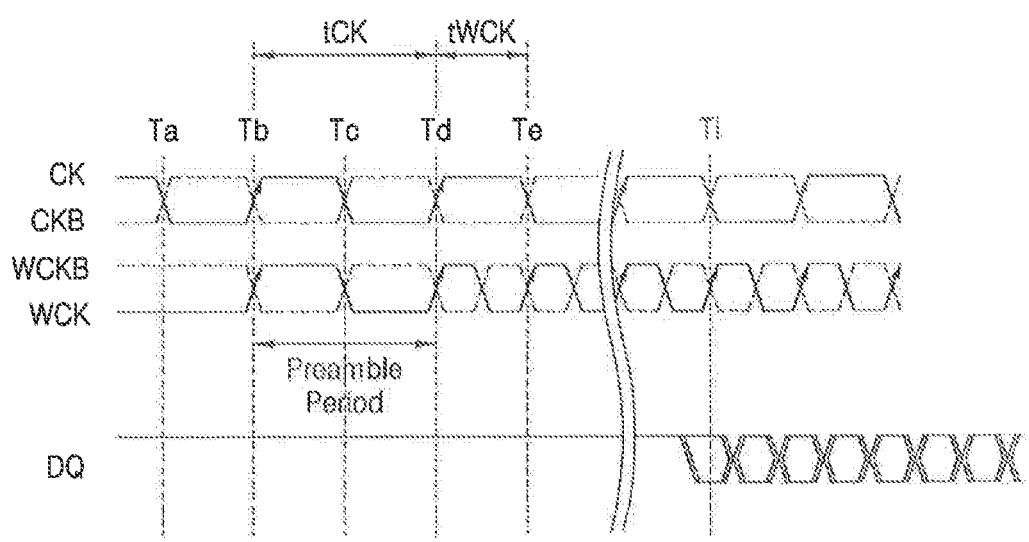

FIGS. 5A and 5B are timing diagrams for describing a data clock signal having a dynamic frequency according to an exemplary embodiment of the inventive concept.

Referring to FIG. 5A, the main clock signal CK and the data clock signal WCK may be received by the memory device 120 (see FIG. 1). The data clock signal WCK may have a preamble period before a time when the data DQ is input/output. The data clock signal WCK may be set to have a variable frequency so that a frequency of the preamble period and a frequency of a data input/output period are set to be different from each other. In other words, the data clock signal WCK may be set to have a dynamic frequency.

The main clock signal CK may be received from a time Ta. A falling edge of the main clock signal CK may be input at the time Ta, a rising edge of the main clock signal CK may be input at a time Tb, a falling edge of the main clock signal CK may be input at a time Tc, a rising edge of the main clock signal CK may be input at a time Td, and a falling edge of the main clock signal CK may be input at a time Te. The main clock signal CK may have a clock cycle period of tCK.

The data clock signal WCK may be received from the time Tb. The data clock signal WCK may have a preamble period from the time Tb to the time Td and may be supplied as a continuous alternating inversion signal from the time Td. The data clock signal WCK may be set to have one clock cycle period of tCK identical to the frequency of the main clock signal CK during the preamble period. The data clock signal WCK may be set to twice the frequency of the main clock signal CK from the time Td after the preamble period.

According to an exemplary embodiment of the inventive concept, the data clock signal WCK may be set to have a preamble period having various frequencies. For example, the preamble period of the data clock signal WCK may be set to one tCK clock cycle period, or may be set to n (where n is a natural number equal to or more than two) number of tCK clock cycle periods. Alternatively, the preamble period of the data clock signal WCK may be set to n (where n is a natural number equal to or more than two) number of tCK/2 clock cycle periods.

After the preamble period of the data clock signal WCK, the data DQ may be transmitted based on the data clock signal WCK. For example, the data DQ may be transmitted based on the data clock signal WCK at the time Te after one clock cycle "tWCK" of the data clock signal WCK from the time Td after the preamble period.

As another example, as shown in FIG. 5B, the data DQ may be transmitted based on the data clock signal WCK at a time T1 after a plurality of clock cycles "tWCK" of the data clock signal WCK from the time Td after the preamble period.

In the present embodiment, a transmission time (or an input/output time) of the data DQ based on the data clock signal WCK may be set to a time when a data clock signal cycle "tWCK", for example, an n*tWCK (where n is a natural number equal to or more than one) clock cycle, elapses after the preamble period of the data clock signal WCK.

In an exemplary embodiment of the inventive concept, a transmission time (or an input/output time) of the data DQ based on the data clock signal WCK may be set to a time when a half data clock signal cycle "tWCK/2", for example, an n*tWCK/2 (where n is a natural number equal to or more than one) clock cycle, elapses after the preamble period of the data clock signal WCK.

Hereinafter, a memory device for performing a clock synchronizing operation by using the data clock signal WCK having the dynamic frequency of FIG. 5 and a clock synchronizing method will be described in detail with reference to FIGS. 6 to 12.

Figure 6:
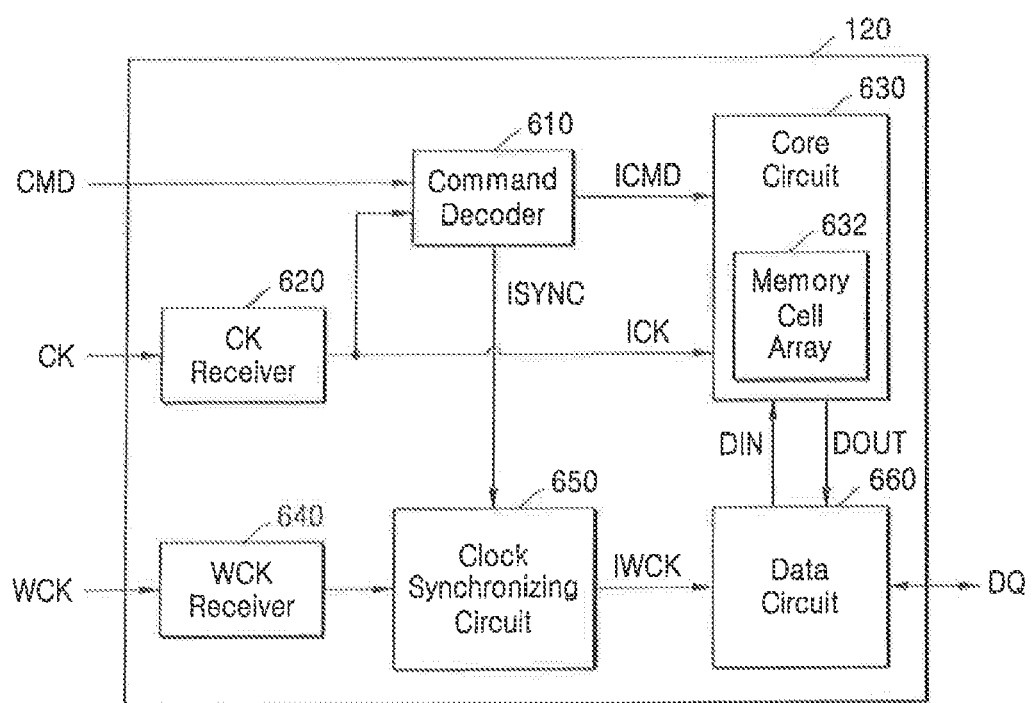
FIG. 6 is a diagram for describing a multiple clock domain memory device according to an exemplary embodiment of the inventive concept.

FIG. 6 is a diagram for describing a multiple clock domain memory device 120 according to an exemplary embodiment of the inventive concept.

Referring to FIG. 6, the memory device 120 may include a command decoder 610, a main clock receiver 620, a core circuit 630, a data clock receiver 640, a clock synchronizing circuit 650, and a data circuit 660.

The command decoder 610 may receive a command CMD or CMD_SYNC transmitted through the command bus 12 (see FIG. 1) from the memory controller 110 (see FIG. 1). The command decoder 610 may decode the received command CMD to generate an internal command signal ICMD and a clock synchronization signal ISYNC.

The command decoder 610 may generate the internal command signal ICMD including a read signal or a write signal according to a received read command RD_CMD or write command WR_CMD. The internal command signal ICMD may be supplied to the core circuit 630. The internal command signal ICMD may control a data reading operation or a data writing operation performed by the core circuit 630.

The command decoder 610 may generate the clock synchronization signal ISYNC in response to a received clock synchronization command CMD_SYNC or an internal main clock signal ICK supplied from the main clock receiver 620. The clock synchronization signal ISYNC may be generated as a pulse signal with a period corresponding to the received clock synchronization command CMD_SYNC. The clock synchronization signal ISYNC may be supplied to the clock synchronizing circuit 650.

The main clock receiver 620 may receive the main clock signal CK transmitted through the first clock signal line 11 (see FIG. 1) from the memory controller 110. The main clock receiver 620 may buffer the received main clock signal CK to generate the internal main clock signal ICK and may supply the internal main clock signal ICK to the command decoder 610 and the core circuit 630. A phase of the buffered internal main clock signal ICK may be approximately equal to that of the main clock signal CK.

The core circuit 630 may include a memory cell array 632. In a read operation of the memory device 120, the core circuit 630 may read data from the memory cell array 632 in response to the internal command signal ICMD and the internal main clock signal ICK which are read signals. In a write operation of the memory device 120, the core circuit 630 may write data in the memory cell array 632 in response to the internal command signal ICMD and the internal main clock signal ICK which are write signals.

The core circuit 630 may further include a row decoder and a column decoder which are connected to the memory cell array 632. The memory cell array 632 may include a plurality of memory cells which are arranged in rows and columns. Each of the plurality of memory cells may be configured with one access transistor and one storage capacitor. The memory cells may have an arrangement structure in which the memory cells are disposed near intersection points of a plurality of word lines and a plurality of bit lines forming a matrix.

The row decoder may decode a row address signal ADDR received through the address bus 13 (see FIG. 1) and may drive a word line selected from among the plurality of word lines connected to the memory cells of the memory cell array 632 according to a decoded row address signal. The column decoder may decode a column address signal ADDR received through the address bus 13 and may perform column gating according to a decoded column address signal to select the bit lines connected to the memory cells of the memory cell array 632.

The data clock receiver 640 may receive the data clock signal WCK transmitted through the second clock signal line 14 (see FIG. 1) from the memory controller 110. The data clock receiver 640 may buffer the received data clock signal WCK to supply the buffered data clock signal WCK to the clock synchronizing circuit 650.

The clock synchronizing circuit 650 may receive the data clock signal WCK buffered by the data clock receiver 640 and the clock synchronization signal ISYNC to perform a clock synchronizing operation. As a result of the clock synchronizing operation, the clock synchronizing circuit 650 may generate an internal data clock signal IWCK which includes first to fourth internal data clock signals IWCK/2_0, IWCK/2_90, IWCK/2_180, and IWCK/2_270. The internal data clock signal IWCK may be supplied to the data circuit 660.

The data circuit 660 may include a data input circuit and a data output circuit. In response to the internal data clock signal IWCK, the data input circuit may align and latch the write data DQ input through the data bus 15 (see FIG. 1) to supply write data DIN to the memory cell array 632. In response to the internal data clock signal IWCK, the data output circuit may transmit read data DOUT, read from the memory cell array 632, as output data DQ to the memory controller 110.

In a write operation, the data circuit 660 may operate so that the write data DQ input from the memory controller 110 is sampled by using the internal data clock signal IWCK, and data obtained through the sampling is written in the memory cell array 632 by using the internal main clock signal ICK. In addition, in a read operation, the data circuit 660 may operate so that data is read from the memory cell array 632 by using the internal main clock signal ICK, and the read data is transmitted to the memory controller 110 by using the internal data clock signal IWCK.

In the memory device 120, since the internal main clock signal ICK and the internal data clock signal IWCK are synchronized with each other by the clock synchronizing circuit 650, synchronization may be made between a domain operating based on the internal main clock signal ICK and a domain operating based on the internal data clock signal IWCK. Therefore, the memory device 120 may perform data communication without missing data in a high speed data interface.

Figure 7:
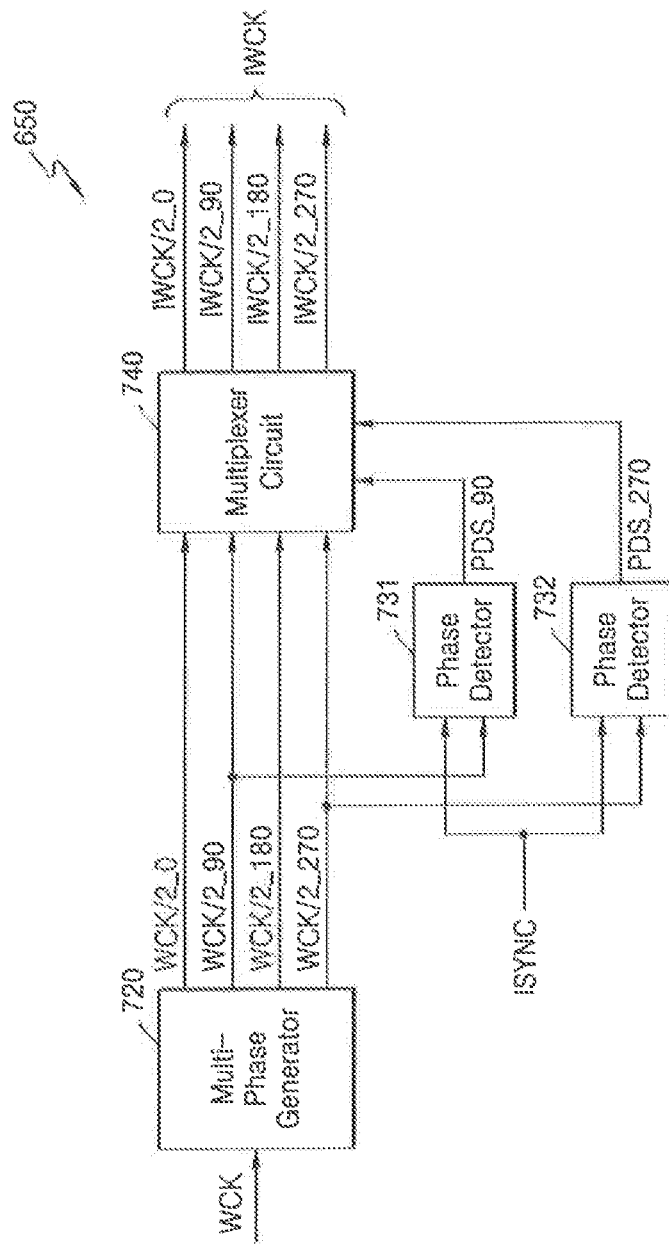
FIG. 7 is a diagram for describing a clock synchronizing circuit of FIG. 6 according to an exemplary embodiment of the inventive concept.
Figure 8A:
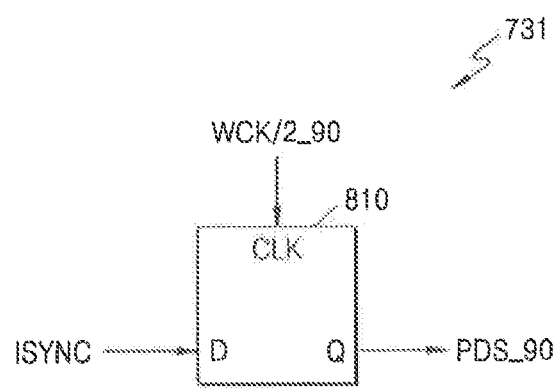
FIGS. 8A and 8B are diagrams for describing first and second phase detectors of FIG. 7 according to an exemplary embodiment of the inventive concept.
Figure 8B:
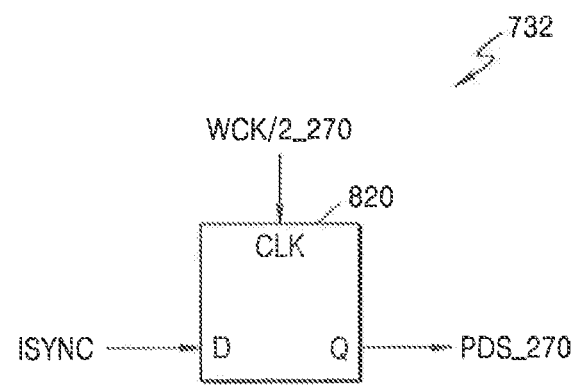
Figure 9:
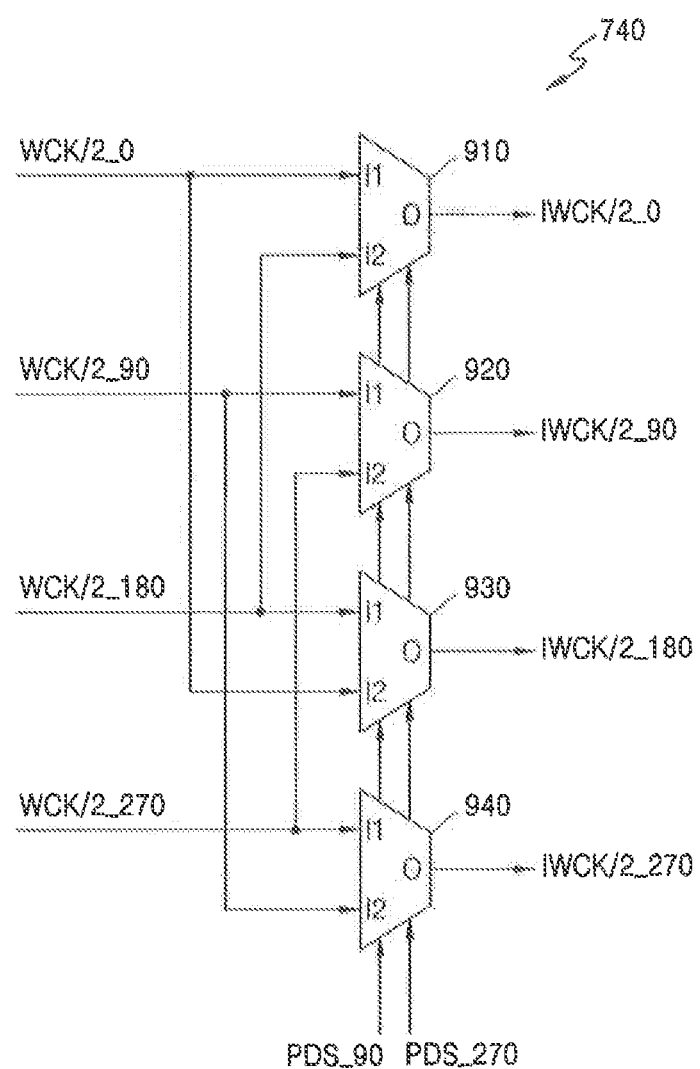
FIG. 9 is a diagram for describing a multiplexer of FIG. 7 according to an exemplary embodiment of the inventive concept.

FIGS. 7 to 9 are diagrams for describing the clock synchronizing circuit of FIG. 6, according to an exemplary embodiment of the inventive concept. FIGS. 8A and 8B are circuit diagrams for describing first and second phase detectors 731 and 732 of FIG. 7, according to an exemplary embodiment of the inventive concept. FIG. 9 is a circuit diagram for describing a multiplexer 740 of FIG. 7, according to an exemplary embodiment of the inventive concept.

Referring to FIG. 7, the clock synchronizing circuit 650 may divide the data clock signal WCK to generate a plurality of division clock signals WCK/2_0, WCK/2_90, WCK/2_180, and WCK/2_270. The clock synchronizing circuit 650 may generate the internal data clock signal IWCK synchronized with the internal main clock signal ICK (see FIG. 6), based on the clock synchronization signal ISYNC. The clock synchronizing circuit 650 may include a multi-phase generator 720, first and second phase detectors 731 and 732, and a multiplexer circuit 740. The data clock signal WCK may be the data clock signal WCK having the dynamic frequency described above with reference to FIGS. 5A and 5B.

The multi-phase generator 720 may shift a phase of the data clock signal WCK by 0 degrees, 90 degrees, 180 degrees, and 270 degrees by using a divider to generate first to fourth division clock signals WCK/2_0, WCK/2_90, WCK/2_180, and WCK/2_270. For example, the multi-phase generator 720 may generate the first to fourth division clock signals WCK/2_0, WCK/2_90, WCK/2_180, and WCK/2_270 respectively having phases obtained from 0-degree, 90-degree, 180-degree, and 270-degree phase shifts of an output of the divider which receives the data clock signal WCK as input.

In response to the second and fourth division clock signals WCK/2_90 and WCK/2_270, each of the first and second phase detectors 731 and 732 may latch the clock synchronization signal ISYNC to generate first and second phase detection signals PDS_90 and PDS_270.

The first phase detector 731, as illustrated in FIG. 8A, may include a flip-flop 810 that latches the clock synchronization signal ISYNC to output the first phase detection signal PDS_90 in response to the second division clock signal WCK/2_90. The second phase detector 732, as illustrated in FIG. 8B, may include a flip-flop 820 that latches the clock synchronization signal ISYNC to output the second phase detection signal PDS_270 in response to the fourth division clock signal WCK/2_270.

For example, in a case where the first phase detector 731 latches the clock synchronization signal ISYNC in response to the second division clock signal WCK/2_90, when a logic level of the latched clock synchronization signal ISYNC is logic high, the first phase detection signal PDS_90 may be generated at a logic high level. This indicates that a logic high level of the clock synchronization signal ISYNC is aligned with a rising edge of the second division clock signal WCK/2_90.

According to an exemplary embodiment of the inventive concept, the first phase detector 731 may capture a logic level of the clock synchronization signal ISYNC by using a falling edge of the second division clock signal WCK/2_90.

Here, since the clock synchronization signal ISYNC is generated in association with the internal main clock signal ICK (see FIG. 6), the second division clock signal WCK/2_90 aligned with the clock synchronization signal ISYNC may be a signal synchronized with the internal main clock signal ICK. In this case, the second phase detector 732 may latch the clock synchronization signal ISYNC to generate the second phase detection signal PDS_270 having a logic low level in response to the fourth division clock signal WCK/2_270 which is in a state where its phase is inverted by 180 degrees with respect to the second division clock signal WCK/2_90.

As another example, when a logic level of the clock synchronization signal ISYNC which has been latched by the first phase detector 731 in response to the second division clock signal WCK/2_90 is logic low, the first phase detection signal PDS_90 may be generated at a logic low level. In this case, the second phase detector 732 may latch the clock synchronization signal ISYNC to generate the second phase detection signal PDS_270 having a logic high level in response to the fourth division clock signal WCK/2_270 which is in a state where its phase is inverted by 180 degrees with respect to the second division clock signal WCK/2_90. This indicates that a logic high level of the clock synchronization signal ISYNC is aligned with a rising edge of the fourth division clock signal WCK/2_270, and the fourth division clock signal WCK/2_270 may be a signal synchronized with the internal main clock signal ICK.

According to an exemplary embodiment of the inventive concept, the second phase detector 732 may capture a logic level of the clock synchronization signal ISYNC by using a falling edge of the fourth division clock signal WCK/2_270.

The first and second phase detection signals PDS_90 and PDS_270 may be supplied to the multiplexer 740 of FIG. 9 and may act as control signals for generating the internal data clock signals IWCK/2_0, IWCK/2_90, IWCK/2_180, and IWCK/2_270.

Referring to FIG. 9, the multiplexer circuit 740 may include first to fourth multiplexers 910, 920, 930, and 940. The first multiplexer 910 may receive the first division clock signal WCK/2_0 through a first input terminal I1 and may receive through a second input terminal I2 the third division clock signal WCK/2_180 which is in a state where its phase is inverted by 180 degrees with respect to the first division clock signal WCK/2_0. The first multiplexer 910 may select one signal from among the first division clock signal WCK/2_0 at the first input terminal I1 and the third division clock signal WCK/2_180 at the second input terminal I2 to output the selected signal as the first internal data clock signal IWCK/2_0 in response to the first and second phase detection signals PDS_90 and PDS_270.

For example, when the first phase detection signal PDS_90 is at a logic high level and the second phase detection signal PDS_270 is at a logic low level, the first multiplexer 910 may select the first division clock signal WCK/2_0 at the first input terminal I1 to be output as the first internal data clock signal IWCK/2_0. On the other hand, when the first phase detection signal PDS_90 is at a logic high level and the second phase detection signal PDS_270 is at a logic high level, the first multiplexer 910 may select the third division clock signal WCK/2_180 at the second input terminal I2 to be output as the first internal data clock signal IWCK/2_0.

The second multiplexer 920 may receive the second division clock signal WCK/2_90 through a first input terminal I1 and may receive through a second input terminal I2 the fourth division clock signal WCK/2_270 which is in a state where its phase is inverted by 180 degrees with respect to the second division clock signal WCK/2_90. The second multiplexer 920 may select one signal from among the second division clock signal WCK/2_90 and the fourth division clock signal WCK/2_270 to be output as the second internal data clock signal IWCK/2_90 in response to the first and second phase detection signals PDS_90 and PDS_270.

The second multiplexer 920 may select the second division clock signal WCK/2_90 to be output as the second internal data clock signal IWCK/2_90 in response to a logic high level of the first phase detection signal PDS_90. The second multiplexer 920 may select the fourth division clock signal WCK/2_270 to be output as the second internal data clock signal IWCK/2_90 in response to a logic high level of the second phase detection signal PDS_270.

The third multiplexer 930 may receive the third division clock signal WCK/2_180 through a first input terminal I1 and may receive through a second input terminal I2 the first division clock signal WCK/2_0 which is in a state where its phase is inverted by 180 degrees with respect to the third division clock signal WCK/2_180. The third multiplexer 930 may select one signal from among the third division clock signal WCK/2_180 and the first division clock signal WCK/2_0 to be output as the third internal data clock signal IWCK/2_180 in response to the first and second phase detection signals PDS_90 and PDS_270.

The third multiplexer 930 may select the third division clock signal WCK/2_180 to be output as the third internal data clock signal IWCK/2_180 in response to a logic high level of the first phase detection signal PDS_90. The third multiplexer 930 may select the first division clock signal WCK/2_0 to be output as the third internal data clock signal IWCK/2_180 in response to a logic high level of the second phase detection signal PDS_270.

The fourth multiplexer 940 may receive the fourth division clock signal WCK/2_270 through a first input terminal I1 and may receive through a second input terminal I2 the second division clock signal WCK/2_90 which is in a state where its phase is inverted by 180 degrees with respect to the fourth division clock signal WCK/2_270. The fourth multiplexer 940 may select one signal from among the fourth division clock signal WCK/2_270 and the second division clock signal WCK/2_90 to be output as the fourth internal data clock signal IWCK/2_270 in response to the first and second phase detection signals PDS_90 and PDS_270.

The fourth multiplexer 940 may select the fourth division clock signal WCK/2_270 to be output as the fourth internal data clock signal IWCK/2_270 in response to a logic high level of the first phase detection signal PDS_90. The fourth multiplexer 940 may select the second division clock signal WCK/2_90 to be output as the fourth internal data clock signal IWCK/2_270 in response to a logic high level of the second phase detection signal PDS_270.

In the present embodiment, in response to a logic high level of the first phase detection signal PDS_90, the multiplexer circuit 740 may receive the first to fourth division clock signals WCK/2_0, WCK/2_90, WCK/2_180, and WCK/2_270 input through the respective first input terminals I1 of the first to fourth multiplexers 910 to 940 to output the first to fourth internal data clock signals IWCK/2_0, IWCK/2_90, IWCK/2_180, and IWCK/2_270. In response to a logic high level of the second phase detection signal PDS_270, the multiplexer circuit 740 may output the first to fourth internal data clock signals IWCK/2_0, IWCK/2_90, IWCK/2_180, and IWCK/2_270 each corresponding to a division clock signals which is in a state where its phase is inverted by 180 degrees with respect to the division clock signal provided to its first input terminal I1.

Figure 10:
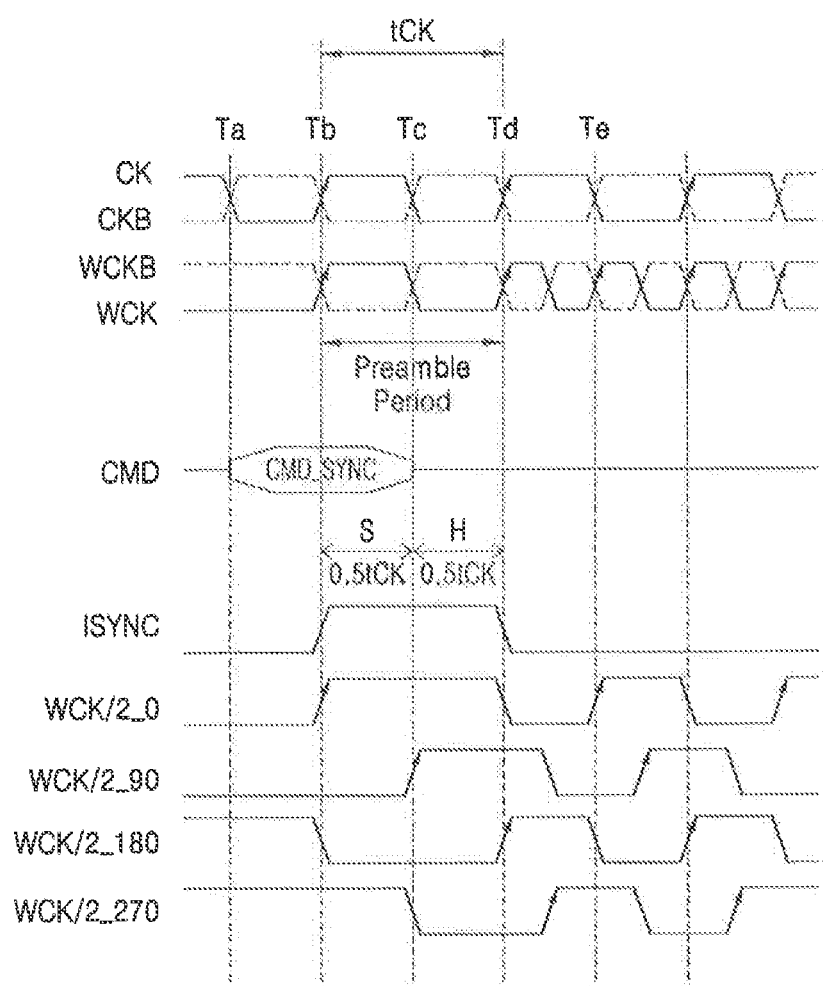
FIGS. 10 and 11 are timing diagrams for describing an operation of a clock synchronizing circuit of FIG. 7 according to an exemplary embodiment of the inventive concept.
Figure 11:
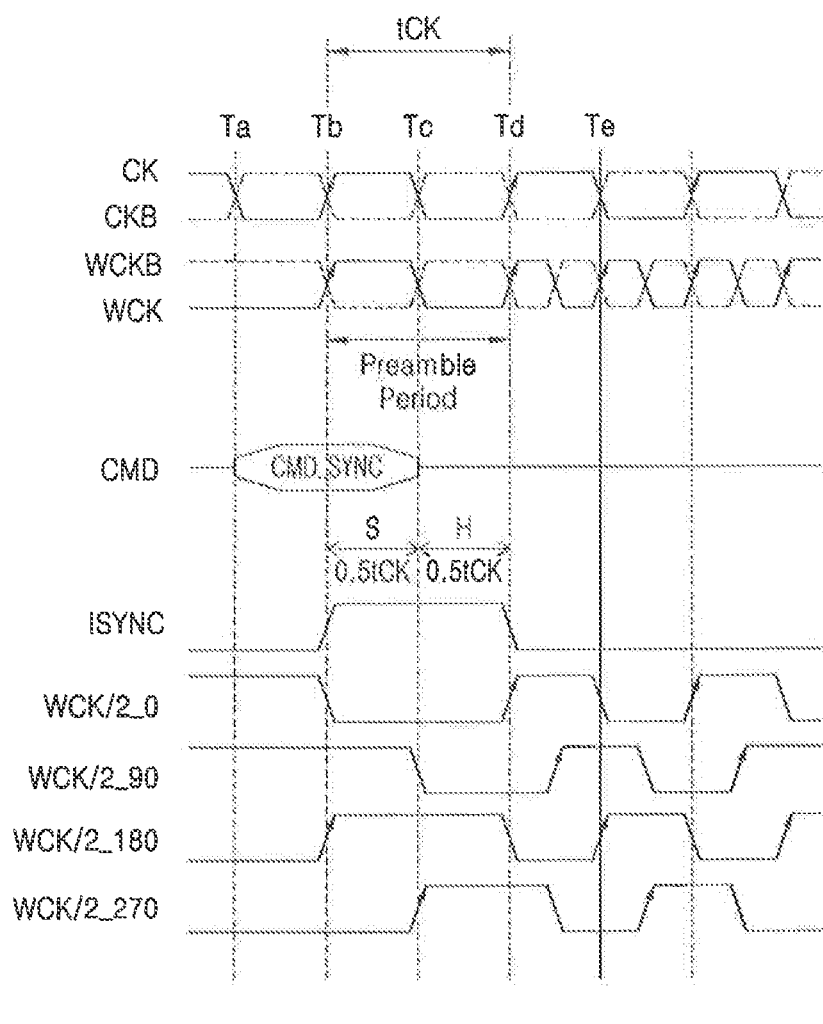

FIGS. 10 and 11 are timing diagrams for describing an operation of a clock synchronizing circuit of FIG. 7, according to an exemplary embodiment of the inventive concept. FIG. 10 is for describing a misaligned state in which clock synchronization is not made between the main clock signal CK and the data clock signal WCK. FIG. 11 is for describing an aligned state in which clock synchronization is made between the main clock signal CK and the data clock signal WCK. FIGS. 10 and 11 will be described in reference to FIGS. 1, 5A, 5B, 6, 7, 8A, 8B and 9.

Referring to FIG. 10, the main clock signal CK and the data clock signal WCK may be received by the memory device 120 (see FIG. 1).

The main clock signal CK having a clock cycle period of tCK may be received from a time Ta. A falling edge of the main clock signal CK may be input at the time Ta, a rising edge of the main clock signal CK may be input at a time Tb, a falling edge of the main clock signal CK may be input at a time Tc, a rising edge of the main clock signal CK may be input at a time Td, and a falling edge of the main clock signal CK may be input at a time Te.

At the time Ta, the clock synchronization command CMD_SYNC may be received along with the clock signal CK.

The data clock signal WCK having a preamble period may be received from the time Tb. The data clock signal WCK may have a preamble period from the time Tb to the time Td and may have a data input/output period from the time Td. The preamble period of the data clock signal WCK may have the same clock frequency as that of the main clock signal CK. The data input/output period of the data clock signal WCK may have a clock frequency which is twice the frequency of the main clock signal CK. The data clock signal WCK may be set to have a variable frequency (e.g., a dynamic frequency) so that a frequency of the preamble period differs from that of data input/output period.

At the time Tb, the clock synchronization signal ISYNC may be generated from the clock synchronization command CMD_SYNC synchronized with the main clock signal CK by the command decoder 610 (see FIG. 6). The first to fourth division clock signals WCK/2_0, WCK/2_90, WCK/2_180, and WCK/2_270 may be generated from the data clock signal WCK by the multi-phase generator 720 (see FIG. 7).

The first division clock signal WCK/2_0 may have the same phase as that of the division clock signal WCK/2, the second division clock signal WCK/2_90 may have a phase obtained through a 90-degree shift from the division clock signal WCK/2, the third division clock signal WCK/2_180 may have a phase obtained through a 180-degree shift from the division clock signal WCK/2, and the fourth division clock signal WCK/2_270 may have a phase obtained through a 270-degree shift from the division clock signal WCK/2.

At the time Tc, when the main clock signal CK has a falling edge, the clock synchronizing circuit 650 may latch the clock synchronization signal ISYNC in response to falling edges of the second and/or fourth division clock signals WCK/2_90 and WCK/2_270. For example, when a logic level of the clock synchronization signal ISYNC latched based on the falling edge of the fourth division clock signal WCK/2_270 is logic high, the clock synchronizing circuit 650 may output the second phase detection signal PDS_270 having a logic high level. This represents a misaligned state where clock synchronization is not made between the main clock signal CK and the data clock signal WCK.

In response to the second phase detection signal PDS_270 having a logic high level, the clock synchronizing circuit 650 may output the first to fourth internal data clock signals IWCK/2_0, IWCK/2_90, IWCK/2_180, and IWCK/2_270 corresponding to division clock signals which are in a state where a phase is inverted by 180 degrees with respect to each of the first to fourth division clock signals WCK/2_0, WCK/2_90, WCK/2_180, and WCK/2_270.

According to an exemplary embodiment of the inventive concept, at the time Tc, the clock synchronizing circuit 650 may latch the clock synchronization signal ISYNC in response to rising edges of the second and/or fourth division clock signals WCK/2_90 and WCK/2_270.

The clock synchronizing circuit 650 may have an align margin including a setup time S of 0.5 tCK and a hold time H of 0.5 tCK when determining a logic level of the clock synchronization signal ISYNC in response to the fourth division clock signal WCK/2_270. Even when an align margin is more strictly applied, the align margin may include a setup time S of 0.25 tCK and a hold time H of 0.25 tCK.

Therefore, even when the align margin including the setup time S of 0.25 tCK and the hold time H of 0.25 tCK is strictly applied, the memory device 120 secures twice the align margin in comparison with a setup time S of 0.125 tCK and a hold time H of 0.125 tCK. Therefore, the memory device 120 secures an increased align margin when performing a clock synchronizing operation by using the data clock signal WCK having the dynamic frequency.

Referring to FIG. 11, similar to FIG. 10, the main clock signal CK having a clock cycle period of tCK may be received from a time Ta, and the data clock signal WCK having a preamble period may be received from a time Tb. At the time Tb, in response to the clock synchronization command CMD_SYNC, the first to fourth division clock signals WCK/2_0, WCK/2_90, WCK/2_180, and WCK/2_270 may be generated from the data clock signal WCK by the clock synchronizing circuit 650.

At a time Tc, when the main clock signal CK has a falling edge, the clock synchronizing circuit 650 may latch the clock synchronization signal ISYNC in response to falling edges of the second and/or fourth division clock signals WCK/2_90 and WCK/2_270. When a logic level of the clock synchronization signal ISYNC latched based on the falling edge of the second division clock signal WCK/2_90 is logic high, the clock synchronizing circuit 650 may output the first phase detection signal PDS_90 having a logic high level. This represents an aligned state where clock synchronization is made between the main clock signal CK and the data clock signal WCK.

According to an exemplary embodiment of the inventive concept, at the time Tc, the clock synchronizing circuit 650 may latch the clock synchronization signal ISYNC in response to rising edges of the second and/or fourth division clock signals WCK/2_90 and WCK/2_270.

In response to the first phase detection signal PDS_90 having a logic high level, the clock synchronizing circuit 650 may output the first to fourth internal data clock signals IWCK/2_0, IWCK/2_90, IWCK/2_180, and IWCK/2_270 by using the first to fourth division clock signals WCK/2_0, WCK/2_90, WCK/2_180, and WCK/2_270.

The clock synchronizing circuit 650 may have an align margin including a setup time S of 0.5 tCK and a hold time H of 0.5 tCK when determining a logic level of the clock synchronization signal ISYNC in response to the second division clock signal WCK/2_90. Even when an align margin is more strictly applied, the align margin may include a setup time S of 0.25 tCK and a hold time H of 0.25 tCK.

Figure 12:
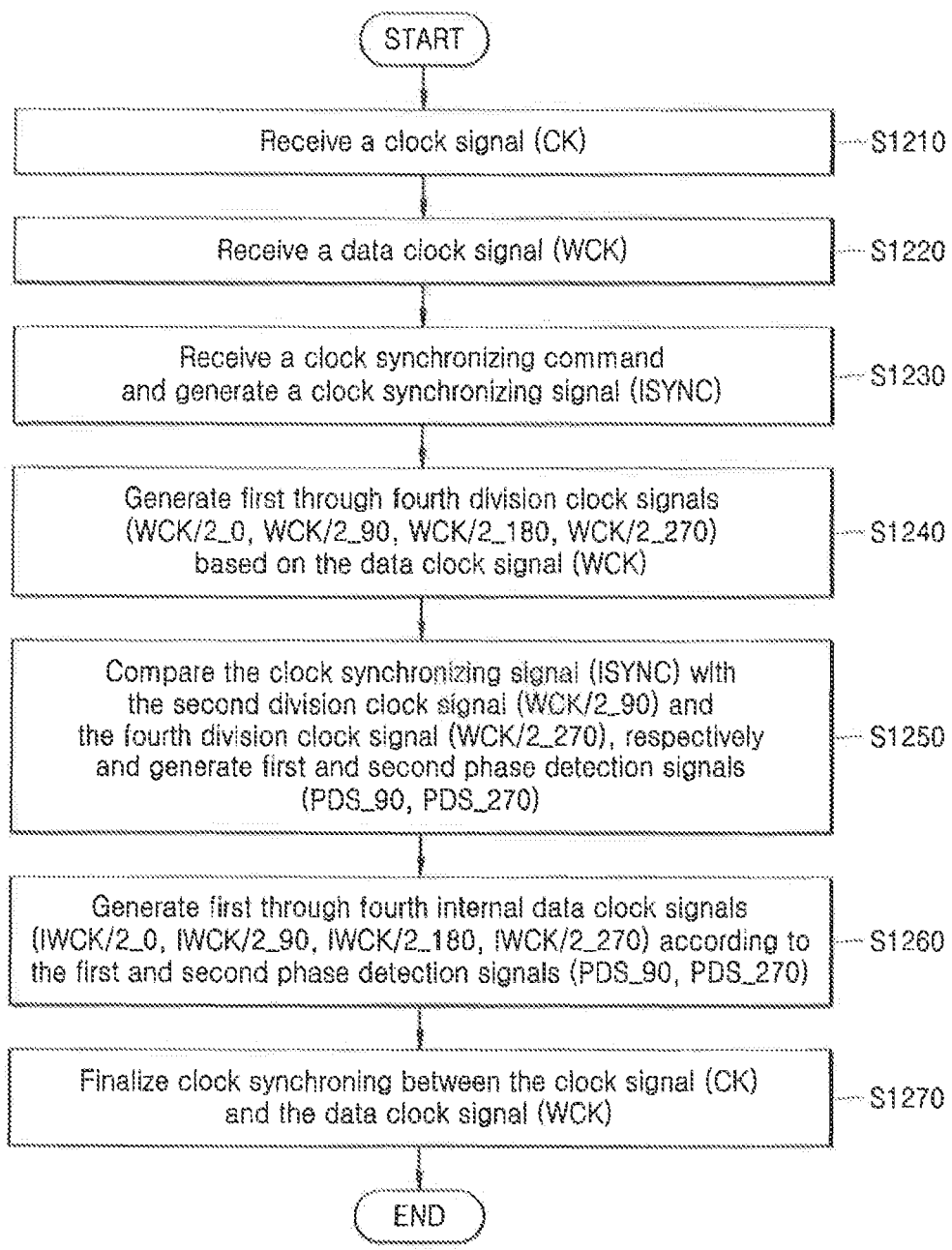
FIG. 12 is a flowchart of a clock synchronizing operation performed by a memory device of FIG. 6 according to an exemplary embodiment of the inventive concept.

FIG. 12 is a flowchart for describing a clock synchronizing operation performed by a memory device of FIG. 6, according to an exemplary embodiment of the inventive concept.

Referring to FIG. 12 in association with FIG. 6, in operation S1210, the memory device 120 may receive the clock signal CK transmitted through the first clock signal line 11 (see FIG. 1) from the memory controller 110 (see FIG. 1).

In operation S1220, the memory device 120 may receive the data clock signal WCK transmitted through the second clock signal line 14 (see FIG. 1) from the memory controller 110. The data clock signal WCK may have a preamble period before a time when the data DQ is input/output, and may be set to have a dynamic frequency so that a frequency of the preamble period and a frequency of a data input/output period are differently set. In the data clock signal WCK, the preamble period may be set to have the same clock frequency as that of the main clock signal CK, and the data input/output period may be set to have a clock frequency which is twice the clock frequency of the main clock signal CK.

In operation S1230, the memory device 120 may receive a clock synchronization command CMD_SYNC transmitted through the command bus 12 (see FIG. 1) from the memory controller 110 (see FIG. 1). The memory device 120 may generate the clock synchronization signal ISYNC according to the clock synchronization command CMD_SYNC.

In operation S1240, the memory device 120 may generate the first to fourth division clock signals WCK/2_0, WCK/2_90, WCK/2_180, and WCK/2_270, based on the data clock signal WCK. The first division clock signal WCK/2_0 may have a phase obtained by twice-dividing the data clock signal WCK, the second division clock signal WCK/2_90 may have a phase obtained through a 90-degree shift from the first division clock signal WCK/2_0, the third division clock signal WCK/2_180 may have a phase obtained through a 180-degree shift from the first division clock signal WCK/2_0, and the fourth division clock signal WCK/2_270 may have a phase obtained through a 270-degree shift from the first division clock signal WCK/2_0.

In operation S1250, the memory device 120 may compare the clock synchronization signal ISYNC with each of the second and fourth division clock signals WCK/2_90 and WCK/2_270 and may generate the first and second phase detection signals PDS_90 and PDS_270, based on a result of the comparison. In response to a falling edge of the second division clock signal WCK/2_90, the memory device 120 may determine a logic level of the clock synchronization signal ISYNC to generate the first phase detection signal PDS_90, and in response to a falling edge of the fourth division clock signal WCK/2_270, the memory device 120 may determine the logic level of the clock synchronization signal ISYNC to generate the second phase detection signal PDS_270.

According to an exemplary embodiment of the inventive concept, in response to a rising edge of the second division clock signal WCK/2_90, the memory device 120 may determine the logic level of the clock synchronization signal ISYNC to generate the first phase detection signal PDS_90, and in response to a rising edge of the fourth division clock signal WCK/2_270, the memory device 120 may determine the logic level of the clock synchronization signal ISYNC to generate the second phase detection signal PDS_270.

In the memory device 120, when the logic level of the clock synchronization signal ISYNC latched based on the second division clock signal WCK/2_90 is logic high, the clock synchronizing circuit 650 may output the first phase detection signal PDS_90 having a logic high level. In the memory device 120, when the logic level of the clock synchronization signal ISYNC latched based on the fourth division clock signal WCK/2_270 is logic high, the clock synchronizing circuit 650 may output the second phase detection signal PDS_270 having a logic high level.

In operation S1260, the memory device 120 may generate the first to fourth internal data clock signals IWCK/2_0, IWCK/2_90, IWCK/2_180, and IWCK/2_270 according to the first and second phase detection signals PDS_90 and PDS_270. In response to a logic high level of the first phase detection signal PDS_90, the memory device 120 may receive the first to fourth division clock signals WCK/2_0, WCK/2_90, WCK/2_180, and WCK/2_270 and output them as the first to fourth internal data clock signals IWCK/2_0, IWCK/2_90, IWCK/2_180, and IWCK/2_270, respectively. In response to a logic high level of the second phase detection signal PDS_270, the memory device 120 may output the first to fourth internal data clock signals IWCK/2_0, IWCK/2_90, IWCK/2_180, and IWCK/2_270 corresponding to division clock signals which are in a state where a phase is inverted by 180 degrees with respect to each of the first to fourth division clock signals WCK/2_0, WCK/2_90, WCK/2_180, and WCK/2_270. For example, the first internal data clock signal IWCK/2_0 corresponds to the third division clock signal WCK/2_180, and the second internal data clock signal IWCK/2_90 corresponds to the fourth division clock signal WCK/2_270.

In operation S1270, the memory device 120 may use the first to fourth internal data clock signals IWCK/2_0, IWCK/2_90, IWCK/2_180, and IWCK/2_270 which are generated in operation S1260, thereby ending a clock synchronizing operation between the main clock signal CK and the data clock signal WCK.

Subsequently, the memory device 120 may perform a data writing operation and a data reading operation by using the first to fourth internal data clock signals IWCK/2_0, IWCK/2_90, IWCK/2_180, and IWCK/2_270. In a write operation, the memory device 120 may operate so that the write data DQ input from the memory controller 110 is sampled by using the first to fourth internal data clock signals IWCK/2_0, IWCK/2_90, IWCK/2_180, and IWCK/2_270, and data obtained through the sampling is written in the memory cell array 632 by using the main clock signal CK. In addition, in a read operation, the memory device 120 may operate so that data is read from the memory cell array 632 by using the main clock signal CK, and the read data is transmitted to the memory controller 110 by using the first to fourth internal data clock signals IWCK/2_0, IWCK/2_90, IWCK/2_180, and IWCK/2_270.

Figure 13:
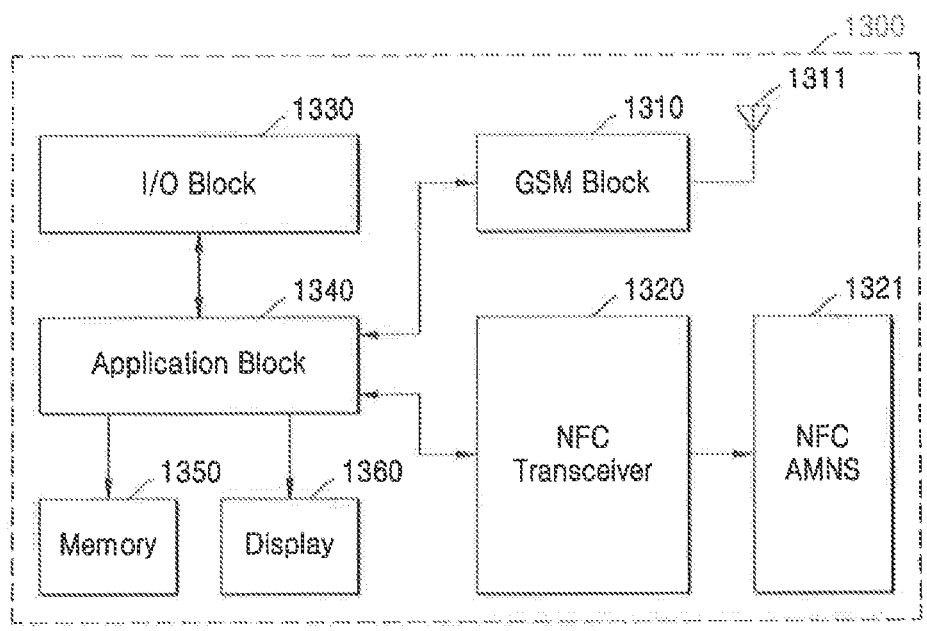
FIG. 13 is a block diagram illustrating an example wherein a memory system for performing a clock synchronizing operation according to exemplary embodiments of the inventive concept is applied to a computing system.

FIG. 13 is a block diagram illustrating an example where the memory device for performing a clock synchronizing operation according to exemplary embodiments of the inventive concept is applied to a mobile device 1300. The mobile device 1300 may be a mobile phone or a smartphone.

Referring to FIG. 13, the mobile device 1300 may include a global system for mobile communication (GSM) block 1310, a near field communication (NFC) transceiver 1320, an input/output (I/O) block 1330, an application block 1340, a memory 1350, and a display 1360. It is to be understood that the mobile device 1300 illustrated in FIG. 13 may include more or fewer elements/blocks. In addition, in the present embodiment, GSM technology is illustrated as being used, but the mobile device 1300 may be implemented by using other technologies such as code division multiple access (CDMA). The elements/blocks of FIG. 13 may be implemented as an integrated circuit (IC) type. Additionally, some of the elements/blocks may be implemented as an IC type, but other elements/blocks may be implemented separately.

The GSM block 1310 may be connected to an antenna 1311 and may perform a wireless phone operation in a known method. The GSM block 1310 may internally include a receiver and a transmitter and may perform reception and transmission operations corresponding thereto.

The NFC transceiver 1320 may be configured to transmit or receive NFC signals through inductive coupling for wireless communication. The NFC transceiver 1320 may supply the NFC signals to an NFC antenna matching network system (NFC AMNS) 1321, and the NFC antenna matching network system (NFC AMNS) 1321 may transmit the NFC signals through the inductive coupling. The NFC antenna matching network system (NFC AMNS) 1321 may receive NFC signals supplied from another NFC device and may supply the received NFC signals to the NFC transceiver 1320.

Transmission and reception of the NFC signals by the NFC transceiver 1320 may be performed in a time division manner. Therefore, a time period where the NFC transceiver 1320 transmits the NFC signals may be referred to as a "transmission period", and a corresponding operation mode of the NFC transceiver 1320 may be treated as a "transmission mode" or an "NFC reader transmission mode". Likewise, a time period where the NFC transceiver 1320 receives the NFC signals may be referred to as a "reception period", and a corresponding operation mode of the NFC transceiver 1320 may be treated as a "reception mode" or an "NFC tag reception mode".

The NFC transceiver 1320 may operate according to rules standardized in ECMA-340, ISO/IEC 18092, ETSI TS 102 190, ISO 21481, ECMA 352, and ETSI TS 102 312 described in NFC interface and protocol-1 (NFCIP-1) and NFC interface and protocol-2 (NFCIP-2).

The application block 1340 may include hardware circuits (for example, one or more processors) and may operate to provide various user applications provided by the mobile device 1300. The user applications may include voice call operations, data transmission, data swap, etc. The application block 1340 may operate along with the GSM block 1310 and/or the NFC transceiver 1320 to provide the operation features of the GSM block 1310 and/or the NFC transceiver 1320. Additionally, the application block 1340 may include a program for a point of sale (POS). The program may provide a credit card purchase and payment function using a mobile phone, for example, a smartphone.

The display 1360 may display an image in response to display signals received from the application block 1340.

The image may be provided by the application block 1340 or may be generated by a camera built into the mobile device 1300. The display 1360 may internally include a frame buffer for temporarily storing pixel values and may be configured with a liquid crystal display screen along with relevant control circuits.

The I/O block 1330 may provide an input function to a user and may provide outputs which are to be received through the application block 1340.

The memory 1350 may store programs (e.g., commands) and/or data which are to be used by the application block 1340, and may be implemented with random access memory (RAM), read-only memory (ROM), flash memory, and/or the like. Therefore, the memory 1350 may include non-volatile storage devices as well as volatile storage devices. For example, the memory 1350 may correspond to the memory device 120 illustrated in FIG. 6.

The memory 1350 may perform a clock synchronizing operation between a first clock signal CK, supplied from a core circuit connected to a memory cell array, and a second clock signal WCK supplied from a data circuit. The second clock signal WCK may be supplied whenever data is input or output, may have a preamble period having a first clock frequency before a time when the data is input or output, and may have a second clock frequency different from the first clock frequency after the preamble period.

By using a command decoder, the memory 1350 may receive a clock synchronization command during a preamble period of the second clock signal WCK to generate a clock synchronization signal. By using a divider, the memory 1350 may divide the second clock signal WCK to generate first to fourth division clock signals respectively having phases obtained through 0-degree, 90-degree, 180-degree, and 270-degree phase shifts from an output of the divider. By using a clock synchronizing circuit, the memory 1350 may latch the clock synchronization signal in response to the second and fourth division clock signals, which are in a state where a phase is inverted therebetween, among the first to fourth division clock signals. Based on a result of the latch, the memory 1350 may output the first to fourth division clock signals as internal data clock signals or may output division clock signals, which are in a state where a phase is inverted by 180 degrees with respect to each of the first to fourth division clock signals, as the internal data clock signals.

While the inventive concept has been particularly shown and described with reference to exemplary embodiments thereof, it will be understood that various changes in form and details may be made therein without departing from the spirit and scope of the inventive concept as defined by the following claims.

What is claimed is:

1. A method for synchronizing a main clock signal and a data clock signal in a memory device, the method comprising:
    receiving a main clock signal;
    receiving a clock synchronizing command;
    receiving a data clock signal having a first clock frequency in a preamble period and a second clock frequency different from the first clock frequency after the preamble period;
    generating divided data clock signals based on the data clock signal;
    detecting whether the divided data clock signals are aligned or misaligned with the main clock signal during the preamble period in response to the clock synchronizing command; and
    sampling data which is input to or output from the memory device after the preamble period, the data being synchronized with the data clock signal.

2. The method of claim 1, wherein the first clock frequency is same as a frequency of the main clock signal.

3. The method of claim 1, wherein the second clock frequency is two times higher than a frequency of the main clock signal.

4. The method of claim 1, wherein the generating of the divided data clock signals based on the data clock signal comprises:
    generating first, second, third and fourth divided data clock signals, the second divided clock signal having a 90-degree phase shift from the first divided clock signal, the third divided clock signal having a 180-degree phase shift from the first divided clock signal, and the fourth divided clock signal having a 270-degree phase shift from the first divided clock signal.

5. The method of claim 4, further comprising
    generating a clock synchronization signal based on the clock synchronizing command.

6. The method of claim 5, wherein the detecting of whether the divided data clock signals are aligned or misaligned with the main clock signal during the preamble period in response to the clock synchronizing command comprises:
    latching the clock synchronization signal in response to a falling edge of the second divided data clock signal and outputting a first phase detection signal; and
    latching the clock synchronization signal in response to a falling edge of the fourth divided data clock signal and outputting a second phase detection signal,
    wherein the divided data clock signals are aligned with the main clock signal when the first phase detection signal is at a logic high level, and
    wherein the divided data clock signals are misaligned with the main clock signal when the second phase detection signal is at a logic high level.

7. The method of claim 6, further comprising:
    outputting the first to fourth divided data clock signals as first to fourth internal data clock signals of the memory device in response to the logic high level of the first phase detection signal; and
    outputting the first to fourth divided data clock signals, each having a phase inverted, as the first to fourth internal data clock signals in response to the logic high level of the second phase detection signal.

8. The method of claim 1, wherein the sampling of the data which is input to or output from the memory device after the preamble period comprises:
    sampling the data which is transmitted at a time when a predetermined data clock signal cycle elapses after the preamble period.

9. The method of claim 1, wherein the second clock frequency is four times higher than a frequency of the main clock signal.

10. A memory device, comprising:
    a main clock receiver configured to receive a main clock signal;
    a command decoder configured to receive a clock synchronizing command;
    a data clock receiver configured to receive a data clock signal having a first clock frequency in a preamble period and a second clock frequency different from the first clock frequency after the preamble period;
    a multi-phase generator configured to generate divided data clock signals based on the data clock signal;

a clock synchronizing circuit configured to detect whether the divided data clock signals are aligned or misaligned with the main clock signal during the preamble period in response to the clock synchronizing command; and a data circuit configured to sample data which is input to or output from the memory device after the preamble period, the data being synchronized with the data clock signal.

11. The memory device of claim 10, wherein the second clock frequency is two times higher than a frequency of the main clock signal.

12. The memory device of claim 10, wherein the second clock frequency is four times higher than a frequency of the main clock signal.

13. The memory device of claim 10, wherein the multi-phase generator is further configured to generate first, second, third and fourth divided data clock signals, the second divided clock signal having a 90-degree phase shift from the first divided data clock signal, the third divided clock signal having a 180-degree phase shift from the first divided data clock signal, and the fourth divided clock signal having a 270-degree phase shift from the first divided data clock signal.

14. The memory device of claim 13, wherein the command decoder is further configured to generate a clock synchronization signal based on the clock synchronizing command.

15. The memory device of claim 14, wherein the clock synchronizing circuit comprises:
a first phase detector configured to latch the clock synchronization signal in response to a falling edge of the second divided data clock signal and output a first phase detection signal; and
a second phase detector configured to latch the clock synchronization signal in response to a falling edge of the fourth divided data clock signal and output a second phase detection signal,
wherein the divided data clock signals are aligned with the main clock signal when the first phase detection signal is at a logic high level, and
wherein the divided data clock signals are misaligned with the main clock signal when the second phase detection signal is at a logic high level.

16. The memory device of claim 15, further comprising a multiplex circuit configured to:
output the first to fourth divided data clock signals as first to fourth internal data clock signals of the memory device in response to the logic high level of the first phase detection signal; and
output the first to fourth divided data clock signals, each having a phase inverted, as the first to fourth internal data clock signals in response to the logic high level of the second phase detection signal.

17. A memory system, comprising:
a memory controller configured to output a clock synchronization command, a main clock signal and a data clock signal; and
a memory device configured to:
receive the clock synchronization command, the main clock signal and the data clock signal; and
synchronize the data clock signal with the main clock signal in response to the clock synchronization command, the data clock signal having a first clock frequency in a preamble period and a second clock frequency different from the first clock frequency after the preamble period,
wherein the memory device comprises:
a multi-phase generator configured to generate divided data clock signals based on the data clock signal;
a clock synchronizing circuit configured to detect whether the divided data clock signals are aligned or misaligned with the main clock signal during the preamble period in response to the clock synchronizing command; and
a data circuit configured to sample data which is input to or output from the memory device after the preamble period, the data being synchronized with the data clock signal.

18. The memory system of claim 17, wherein the second clock frequency is two times higher than a frequency of the main clock signal.

19. The memory system of claim 17, wherein the second clock frequency is four times higher than a frequency of the main clock signal.

20. The memory system of claim 17, wherein the data circuit samples the data which is transmitted at a time when a predetermined data clock signal cycle elapses after the preamble period.

* * * * *